(12) United States Patent
Zhong

(10) Patent No.: US 10,509,373 B2
(45) Date of Patent: Dec. 17, 2019

(54) CYBER SYNCHRONOUS MACHINE (CYBERSYNC MACHINE)

(71) Applicant: Qingchang Zhong, Willowbrook, IL (US)

(72) Inventor: Qingchang Zhong, Willowbrook, IL (US)

(*) Notice: Subject to any disclaimer, the term of this patent is extended or adjusted under 35 U.S.C. 154(b) by 224 days.

(21) Appl. No.: 15/727,600

(22) Filed: Oct. 7, 2017

(65) Prior Publication Data

US 2018/0348712 A1 Dec. 6, 2018

(30) Foreign Application Priority Data

Jun. 4, 2017 (GB) .................................. 1708886.5

(51) Int. Cl.
| | | |
|---|---|---|
| *G05B 13/02* | (2006.01) | |
| *G05F 1/66* | (2006.01) | |
| *G05B 13/04* | (2006.01) | |
| *G01R 19/25* | (2006.01) | |
| *G01R 21/06* | (2006.01) | |

(Continued)

(52) U.S. Cl.
CPC ......... *G05B 13/024* (2013.01); *G01R 15/142* (2013.01); *G01R 19/2513* (2013.01); *G01R 21/06* (2013.01); *G05B 13/04* (2013.01); *G05F 1/66* (2013.01); *H02P 9/105* (2013.01); *H02J 3/381* (2013.01); *H02J 3/46* (2013.01); *H02P 6/34* (2016.02)

(58) Field of Classification Search
CPC .................................................. G05B 13/024
USPC ....................................................... 700/286
See application file for complete search history.

(56) References Cited

U.S. PATENT DOCUMENTS

| 8,880,236 | B2 | 11/2014 | Weiss | |
|---|---|---|---|---|
| 2016/0006338 | A1* | 1/2016 | Sakimoto | .......... H02M 7/53875 |
| | | | | 363/131 |
| 2017/0047861 | A1* | 2/2017 | Sakimoto | .................. H02J 3/38 |

FOREIGN PATENT DOCUMENTS

| CN | 106410849 A | * | 2/2017 |
|---|---|---|---|
| CN | 106712115 A | * | 5/2017 |

OTHER PUBLICATIONS

Q.-C. Zhong, "Power electronics-enabled autonomous power systems: Architecture and technical routes," IEEE Trans. Ind. Electron., vol. 64, No. 7, pp. 5907-5918, Jul. 2017.

(Continued)

*Primary Examiner* — Jason C Olson

(57) ABSTRACT

This invention discloses a controller and method for a cyber synchronous machine (CSM, in short, cybersync machine), namely, a power electronic converter that is seamlessly equipped with computational algorithms (i.e., the controller) to represent the intrinsic and fundamental principles of physical synchronous machines. The CSM can be operated in the grid-connected mode or the islanded mode to take part in the regulation of the frequency and the voltage. The controller also includes auxiliary blocks to achieve self-synchronization without measuring or estimating the grid frequency and the regulation of real power and reactive power to the given reference values without static errors. The control signal for the power electronic converter can be the output voltage generated by the engendering block or the sum of the output voltage and the virtual current. A unique feature of the disclosed CSM is that, if the system it is connected to is passive, then the whole system is passive and, hence, is guaranteed to be stable.

20 Claims, 4 Drawing Sheets

(51) Int. Cl.
*G01R 15/14* (2006.01)
*H02P 9/10* (2006.01)
H02P 6/34 (2016.01)
H02J 3/46 (2006.01)
H02J 3/38 (2006.01)

(56) References Cited

OTHER PUBLICATIONS

Q.-C. Zhong and G. Weiss, "Synchronverters: Inverters that mimic synchronous generators," IEEE Trans. Ind. Electron., vol. 58, No. 4, pp. 1259-1267, Apr. 2011.

Q.-C. Zhong, P.-L. Nguyen, Z. Ma, and W. Sheng, "Self-synchronised synchronverters: Inverters without a dedicated synchronisation unit," IEEE Trans. Power Electron., vol. 29, No. 2, pp. 617-630, Feb. 2014.

J. W. Simpson-Porco, F. Dörfler, and F. Bullo, "Voltage stabilization in microgrids via quadratic droop control," IEEE Transactions on Automatic Control, vol. 62, No. 3, pp. 1239-1253, 2017.

* cited by examiner (a) $\Sigma_\omega$ (b) $\Sigma_\varphi$

CYBER SYNCHRONOUS MACHINE (CYBERSYNC MACHINE)

CROSS-REFERENCE TO RELATED APPLICATIONS

This nonprovisional patent application claims the benefit of and priority under 35 U.S. Code 119 (b) to U.K. Patent Application No. GB1708886.5 filed on Jun. 4, 2017, entitled "Cyber Synchronous Machine (Cybersync Machine)", the contents of which are all hereby incorporated by reference herein in its entirety.

TECHNICAL FIELD

This invention is concerned with the control and operation of power electronic converters. Possible application fields include renewable energy, such as wind, solar and wave energy, electrical vehicles, energy storage systems, aircraft power systems, different types of loads that require power electronic converters, data centers and so on.

BACKGROUND

Power systems are going through a paradigm change. At the moment, the frequency of a power system is controlled by regulating a small number of large synchronous generators and most loads do not take part in the frequency control of the system. But now, the landscape of power systems is rapidly changing. Various non-synchronous distributed energy resources (DER), including renewables, electric vehicles and energy storage systems, are being connected to power systems. Moreover, most loads that do not take part in frequency control now are expected to take part in frequency control in the future. Hence, the number of active players to take part in frequency control in the future could easily reach millions, which imposes unprecedented challenges to the frequency stability of future power systems. The fundamental challenge behind this paradigm change is that future power systems will be power electronics-based, instead of electric machines-based, with millions of relatively small, non-synchronous and incompatible players. For example, on the supply side, most DERs are connected to power systems through power electronic converters. In transmission and distribution networks, many power electronic converters, such as HVDC links and FACTS devices, are being introduced to electronically control power systems in order to improve efficiency and controllability. On the load side, most loads will be connected to the grid through power electronic converters as well. For example, motors, which consume over 50% of electricity, are much more efficient when equipped with motor drives; Internet devices, which consume over 10% of electricity, have front-end power electronic converters; lighting devices, which consume about 20% of electricity, are being replaced with LED lights, which have front-end power electronic converters as well. The integration of power electronic converters into the electrical grid for distributed generation (DG), often by means of microgrids, has been a topic of intensive research and development.

Most of the converters nowadays are controlled to behave as current sources, through controlling the current exchanged with the grid. However, this makes them incompatible with the power systems, which are dominated by voltage sources.

Power electronic converters could play a similar role as synchronous generators in conventional power systems. Hence, it is reasonable to adopt some of the well established concepts and principles in power systems to control power electronic converters. Recently, it has been shown by the inventor of this disclosure that the well-known droop control strategy structurally resembles the widely-used phase-locked loop and that the conventional synchronous machines resemble the phase-locked loop as well. What is common among these different concepts is their intrinsic synchronization mechanism. The inventor of this disclosure has also shown that this synchronization mechanism should and could be adopted to build future power systems that are dominated by power electronic converters.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

This invention discloses a controller and method for a cyber synchronous machine (CSM, in short, cybersync machine), namely, a power electronic converter that is seamlessly integrated with computational algorithms (i.e. the controller) to represent the intrinsic and fundamental principles of physical synchronous machines, in particular, the synchronization mechanism. The controller consists of (1) a torque-frequency channel to regulate the frequency according to the torque (equivalently, the real power) set-point, (2) a quorte-flux channel to regulate the flux (equivalently, the voltage amplitude) according to the quorte (equivalently, the reactive power) set-point, (3) an engendering block that generates an output voltage according to the frequency generated in the torque-frequency channel and the flux generated in the quorte-flux channel, and also the torque and quorte feedback signals with the additional input of current, and (4) a virtual impedance to generate a virtual current according to the difference of two voltages. The CSM can be operated to regulate the real power and reactive power according to the given real power and reactive power references (called in the set mode), to take part in the regulation of the frequency and the voltage (called in the droop mode), and to synchronize with the grid without estimating or measuring the grid frequency (called in the self-synchronization mode). What is crucial for the disclosed invention is that if the system to which the disclosed CSM is connected is passive, then the whole system is passive and, hence, is guaranteed to be stable.

BRIEF DESCRIPTION OF THE DRAWINGS

The accompanying figures further illustrate the disclosed embodiments and, together with the detailed description of the disclosed embodiments, serve to explain the principles of the present invention.

DETAILED DESCRIPTION

Figure 1:
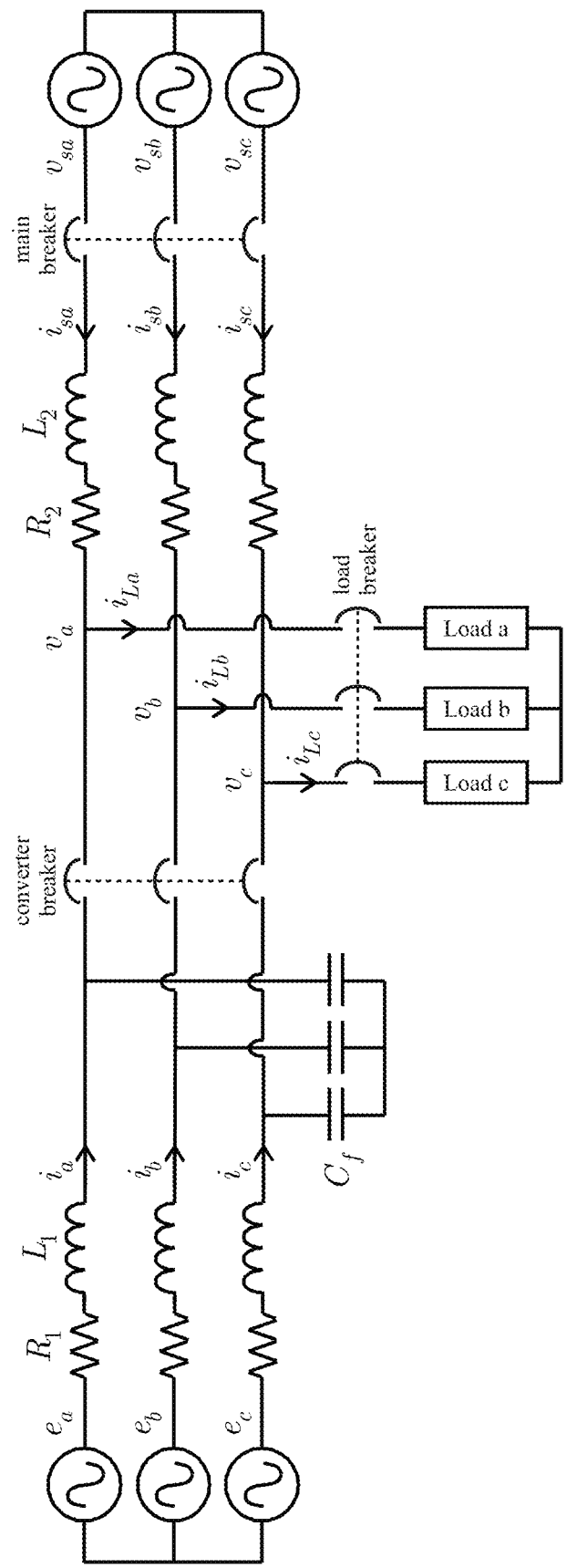
FIG. 1 shows the typical system connected to the grid with the voltage e generated by a power electronic converter.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms such as "and," "or," or "and/or" as used herein may include a variety of meanings that may depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The system under consideration is shown in FIG. 1. A three-phase power electronic converter is represented by ideal voltage sources $e=[e_a \ e_b \ e_c]^T$, without showing the details of the converter bridges, because the switching effect of the power semiconductor devices can be neglected for the purpose of control design as long as the controller can generate the right voltage e and the switching frequency is high enough. The converter may be operated in the grid-connected mode or in the islanded mode. i.e., with the main breaker ON or OFF. The case with a single phase or multiple phases can be treated in a similar way and this disclosure takes three-phase systems as an example.

The converter-side elements $L_1$ and $R_1$ and the capacitor $C_f$ form a LC filter to filter out the switching ripples. The supply-side elements $L_2$ and $R_2$ can be regarded as an additional inductor that is part of an LCL filter and/or a coupling transformer.

The objective of this invention is to disclose a controller and method that generates an output voltage e to render the system shown in FIG. 1 passive and hence stable.

The Disclosed Controller

Figure 2:
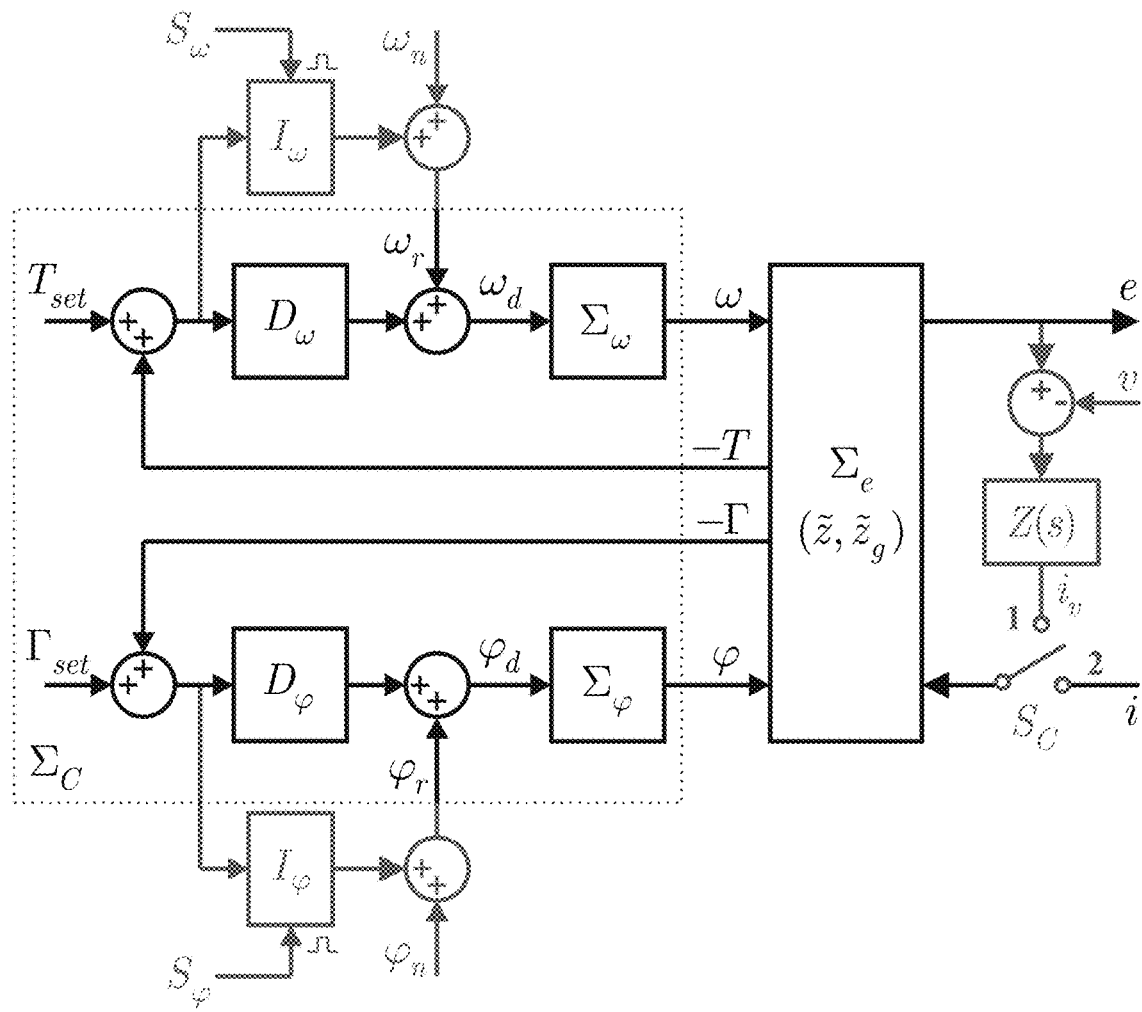
FIG. 2 shows the disclosed controller of a cyber synchronous machine.

The disclosed controller is shown in FIG. 2. The controller consists of the control block $\Sigma_C$, the engendering block $\Sigma_e$ and auxiliary blocks including $I_\omega$, $I_\varphi$ and $Z(s)$ to achieve self-synchronization without measuring or estimating the grid frequency and regulation of real power and reactive power. The block $\Sigma_C$ has two channels, namely the torque-frequency channel and the quorte-flux channel, which includes subsystems $\Sigma_\omega$ and $\Sigma_\varphi$, respectively. The subsystem $E_\omega$ is used to synthesize the frequency $\omega$ and the subsystem $E_\varphi$ is used to synthesize the flux $\varphi$. The engendering block $\Sigma_e$ synthesizes an output voltage e according to the frequency $\omega$ and the flux $\varphi$, with the phase angle $\theta$ of the generated voltage e satisfying $\dot{\theta}=\omega$, and also provides the feedback for the two control channels. The auxiliary block $Z(s)$ is a virtual impedance introduced to generate a virtual current $i_v$ to replace the grid current i during the self-synchronization process. The auxiliary blocks $I_\omega$ and $I_\varphi$ include a resettable integrator to regulate T and $\Gamma$ according to the given set-points $T_{set}$ and $\Gamma_{set}$, which correspond to the desired real power and reactive power.

The Engendering Block $\Sigma_e$:

The ghost operator g is an operator that shifts the phase of a sine or cosine function by $$\frac{\pi}{2}$$

rad leading. Define the sinusoidal and cosinusoidal signals $\tilde{z}=\sin\theta$ and $\tilde{z}_g=g\tilde{z}=\cos\theta$.

In other words, $\tilde{z}_g$ is obtained via applying the ghost operator g to $\tilde{z}$. Note that $\tilde{z}$ and $\tilde{z}_g$ are actually the states of the oscillator $$\begin{bmatrix} \dot{\tilde{z}} \\ \dot{\tilde{z}}_g \end{bmatrix} = \begin{bmatrix} 0 & \omega \\ -\omega & 0 \end{bmatrix} \begin{bmatrix} \tilde{z} \\ \tilde{z}_g \end{bmatrix} \quad (1)$$

with the oscillating frequency $\omega=\dot{\theta}$ being the input. Moreover, define the following sinusoidal vector $$z = \begin{bmatrix} \sin\theta & \sin\left(\theta - \frac{2\pi}{3}\right) & \sin\left(\theta + \frac{2\pi}{3}\right) \end{bmatrix}^T, \quad (2)$$

to represent normalized three-phase voltages. Furthermore, denote $z_g = gz$. Then $$z_g = gz = \begin{bmatrix} \cos\theta & \cos\left(\theta - \frac{2\pi}{3}\right) & \cos\left(\theta + \frac{2\pi}{3}\right) \end{bmatrix}^T$$

is a cosinusoidal vector corresponding to a three-phase system. It is easy to see that the sinusoidal and cosinusoidal vectors z and $z_g$ can be described by the linear combination of the oscillator states as $$\begin{bmatrix} z \\ z_g \end{bmatrix} = \begin{bmatrix} 1 & -\frac{1}{2} & -\frac{1}{2} & 0 & \frac{\sqrt{3}}{2} & -\frac{\sqrt{3}}{2} \\ 0 & -\frac{\sqrt{3}}{2} & \frac{\sqrt{3}}{2} & 1 & -\frac{1}{2} & -\frac{1}{2} \end{bmatrix}^T \begin{bmatrix} \tilde{z} \\ \tilde{z}_g \end{bmatrix}. \quad (3)$$

The output voltage e is designed as $$e = Ez, \quad (4)$$

with $$E = \omega\varphi$$

being the amplitude of the output voltage, which is the product of the frequency $\omega$ and the flux $\varphi$. Because the frequency $\omega$ only varies in a very small range during normal operation, the voltage E is mainly determined by the flux $\varphi$. Denote $e_g = ge$ to represent the "ghost" three-phase voltages, which are 90° leading e. Then, $$e_g = ge = Ez_g. \quad (5)$$

For the three-phase converter shown in FIG. 1, the real power and the reactive power at the mid-point of the conversion legs can be obtained, respectively, as $$P = \langle i, e \rangle, \quad Q = -\langle i, e_g \rangle.$$

Hence, the real power and the reactive power are $$P = \omega\varphi\langle i, z \rangle \triangleq T\omega, \quad Q = -\omega\varphi\langle i, z_g \rangle \triangleq \Gamma\varphi, \quad (6)$$

where $$T = \varphi\langle i, z \rangle = \varphi z^T i \quad (7)$$

resembles the electromagnetic torque of a synchronous machine and $$\Gamma = -\omega\langle i, z_g \rangle = -\omega z_g^T i \quad (8)$$

is a quantity dual to the torque T, for which the word quorte is coined to represent its duality to the torque. Since the frequency $\omega$ and the flux $\varphi$ are often regulated within a small range, respectively, the real power is roughly in proportion to the torque and the reactive power is roughly in proportion to the quorte.

In summary, the block $\Sigma_e$ can be described as $$\Sigma_e: \left\{ \begin{bmatrix} e \\ -T \\ -\Gamma \end{bmatrix} = \begin{bmatrix} 0 & \varphi z & 0 \\ -\varphi z^T & 0 & 0 \\ \omega z_g^T & 0 & 0 \end{bmatrix} \begin{bmatrix} i \\ \omega \\ \varphi \end{bmatrix} \right..$$

with z and $z_g$ obtained via (3) and (1). Apparently, it is not skew-symmetric and not lossless, which causes considerable challenges in rendering the system passive.

For single-phase applications, only the first elements in the vectors z, $z_g$, e and $e_g$ are needed. For multiple-phase applications, the vectors z, $z_g$, e and $e_g$ can be adjusted according to the number of phases to reflect the phase spacing. The vector z and, hence, the output voltage e contain equally spaced sinusoidal signals that can be represented by the linear combination of the oscillator states. In practice, filters may be introduced to filter out the ripples in T and $\Gamma$ before feeding back.

Generation of Desired Frequency $\omega_d$ and Flux $\varphi_d$ Through Droop Control:

The purpose of the blocks $\Sigma_\omega$ and $\Sigma_\varphi$ in FIG. 2 is to generate the frequency $\omega$ and flux $\varphi$ according to the desired frequency $\omega_d$ and desired flux $\varphi_d$, which are designed according to the well-known droop control principle as $$\omega_d = \omega_r + D_\omega(T_{set} - T),$$

$$\varphi_d = \varphi_r + D_\varphi(\Gamma_{set} - \Gamma). \quad (10)$$

Here, $\omega_r$ and $\varphi_r$ are the frequency reference and the flux reference, respectively, and $D_\omega$ and $D_\varphi$ are the frequency droop coefficient and the flux droop coefficient defined, respectively, as $$D_\omega = \frac{\Delta\Omega}{\Delta T}, \quad D_\varphi = -\frac{\Delta\varphi}{\Delta\Gamma} \quad (11)$$

to describe the impact of the torque variation $\Delta T$, corresponding to the active power variation $\Delta P$, and the quorte variation $\Delta\Gamma$, corresponding to the reactive power variation $\Delta Q$, on the frequency variation $\Delta\omega$ and the flux variation $\Delta\varphi$. The reference values $\omega_r$ and $\varphi_r$ are obtained via adding the outputs of the integrator blocks $I_\omega$ and $I_\varphi$ as offsets to the rated values of the frequency and the flux $$\omega_n = 2\pi f_n, \quad \varphi_n = \frac{\sqrt{2}\, V_n}{\omega_n}, \quad (12)$$

respectively, where $f_n$ and $V_n$ are the rated values of the system frequency and the phase voltage (rms). Note that $D_\omega$ and $D_\varphi$ described above are static gains but they can be designed to be dynamic as well. e.g. to include an integrator or to be a filter.

Design of $\Sigma_\omega$ and $\Sigma_\varphi$ to Obtain a Passive $\Sigma_C$:

It can be shown that the block $\Sigma_C$ in FIG. 2 is passive if the desired frequency and flux are designed as in (10) and the blocks $\Sigma_\omega$ and $\Sigma_\varphi$ are designed to be passive as described by $$\Sigma_\omega: \begin{cases} \dot{x}_\omega = (J_\omega - R_\omega)\dfrac{\partial H_\omega}{\partial x_\omega} + \dfrac{1}{D_\omega}G_\omega \omega_d \\ \omega = G_\omega^T \dfrac{\partial H_\omega}{\partial x_\omega}, \end{cases} \quad (13)$$

$$E_\varphi: \begin{cases} \dot{x}_\varphi = (J_\varphi - R_\varphi)\dfrac{\partial H_\varphi}{\partial x_\varphi} + \dfrac{1}{D_\varphi}G_\varphi \varphi_d \\ \varphi = G_\varphi^T \dfrac{\partial H_\varphi}{\partial x_\varphi}, \end{cases} \quad (14)$$

with non-negative Hamiltonians $H_\omega$ and $H_\varphi$, positive semi-definite damping matrices $R_\omega$ and $R_\varphi$, and skew-symmetric matrices $J_\omega$ and $J_\varphi$.

Moreover, it can be mathematically proven that the system shown in FIG. 1 with the controller designed in FIG. 2 as characterized by the block $\Sigma_C$ and the engendering block $\Sigma_e$ (9) is passive and stable.

Regulation and Self-Synchronization Capabilities:

As is well known, the most important and basic requirement for grid-connected converters is to keep synchronized with the grid before and after being connected to the grid so that (1) the converter can be connected to the grid and (2) the converter can exchange the right amount of power with the grid even when the grid voltage changes its frequency, phase and/or amplitude. It has been a norm to adopt a synchronization unit. e.g. a phase-locked loop (PLL) and its variants, to make sure that the converter is synchronized with the grid. The disclosed controller shown in FIG. 2 is able to achieve self-synchronization before being connected to the grid without measuring or estimating the grid frequency.

The virtual impedance $Z(s)$ is added to generate a virtual current $i_v$ before being connected to the grid, according to the voltage difference between two voltages. e.g. e and v. The two integrator blocks $I_\omega$ and $I_\varphi$ regulate $T=T_{set}$ and $\Gamma=\Gamma_{set}$, respectively. If $T_{set}$ and $\Gamma_{set}$ are set as 0, then both T and $\Gamma$ can be regulated to 0 when Switch $S_C$ is at Position 1. This leads to e=v and, hence, the converter is synchronized with the grid. Once the synchronization is achieved, the converter can be connected to the grid. While the converter is connected to the grid, Switch $S_C$ is thrown to Position 2. Then, the converter can be operated in the set mode to regulate T and $\Gamma$ to the set-points $T_{set}$ and $\Gamma_{set}$, respectively, if the integrator blocks $I_\omega$ and $I_\varphi$ are enabled by setting the signals $S_\omega$ and $S_\varphi$ low; it can be operated in the frequency and flux droop mode if the integrator blocks $I_\omega$ and $I_\varphi$ are reset by setting the signals $S_\omega$ and $S_\varphi$ high. The operation modes of the system are summarized in Table I.

The integrator blocks $I_\omega$ and $I_\varphi$ can be a simple integrator with a gain or a more complex transfer function consisting of an integrator, a gain and an additional transfer function. The gains should be small in order to make sure that the desired frequency $\omega_d$ and flux $\varphi_d$ change more slowly than the tracking of the frequency and the flux. The virtual impedance $Z(s)$ can be chosen as a low-pass filter or other impedance that is appropriate.

While the output voltage e is often directly used as the control signal for the power electronic converter, another option is to add the signal $i_v$ onto the output voltage e before using it as the control signal. In this way, it is equivalent to adding an inner voltage loop to regulate the voltage v to be the same as the output voltage e. Effectively, the actual control signal becomes $e+i_v$. This helps eliminate the uncertainties in the converter hardware. e.g. the variations in the DC-bus voltage, the filter inductor and the power semiconductor switches. It is also able to shape the output impedance of the converter by designing $Z(s)$.

TABLE I

OPERATION MODES OF THE DISCLOSED CONTROLLER IN FIG. 2.

| $S_C$ | $S_\omega$ | $S_\varphi$ | Mode |
|---|---|---|---|
| 1 | Low | Low | Self-synchronization |
| 2 | Low | Low | Regulation of T (hence, P) and $\Gamma$(hence, Q) |
| 2 | Low | High | Regulation of T and Droop of $\varphi$ (hence, voltage) |
| 2 | High | Low | Droop of $\omega$ and Regulation of $\Gamma$ |
| 2 | High | High | Droop of $\omega$ and $\varphi$ |

Implementation of the Blocks $\Sigma_\omega$ and $\Sigma_\varphi$

The function of the blocks $\Sigma_\omega$ and $\Sigma_\varphi$ is to track the desired frequency $\omega_d$ and flux $\varphi_d$. There are many options to achieve this. Here, two examples are illustrated. One is to adopt the standard integral controller and the other is to adopt a simple static controller.

Figure 3:
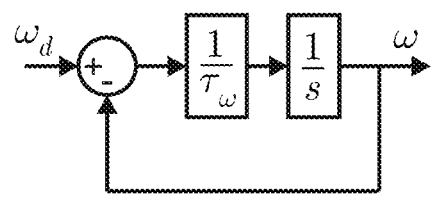
FIG. 3 illustrates a possible implementation of the passive blocks $\Sigma_\omega$ and $\Sigma_\varphi$ in the controller.
Figure 3:
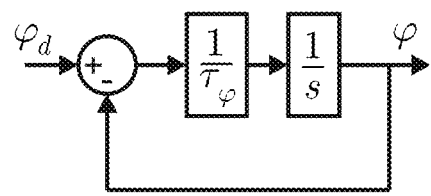

Using the Standard Integral Controller (IC):

FIG. 3 illustrates the implementation with the integrator for the blocks $\Sigma_\omega$ and $\Sigma_\varphi$. It is easy to find that $$\Sigma_\omega = \dfrac{1}{\tau_\omega s + 1}, \; \Sigma_\varphi = \dfrac{1}{\tau_\varphi s + 1}, \quad (15)$$

where $\tau_\omega$ and $\tau_\varphi$ are the time constants of the frequency and flux loops, respectively. Both $\Sigma_\omega$ and $\Sigma_\varphi$ are first-order low-pass filters with a unity static gain. The Hamiltonians can be chosen as $$H_\omega = \dfrac{1}{2}\dfrac{\tau_\omega}{D_\omega}\omega^2, \text{ and } H_\varphi = \dfrac{1}{2}\dfrac{\tau_\varphi}{D_\varphi}\varphi^2.$$

Then, their time derivatives are, respectively, $$\dfrac{\partial H_\omega}{\partial \omega} = \dfrac{\tau_\omega}{D_\omega}\omega, \text{ and } \dfrac{\partial H_\varphi}{\partial \varphi} = \dfrac{\tau_\varphi}{D_\varphi}\varphi.$$

As a result, the block $\Sigma_\omega$ can be written in the form of (13) with $$J_\omega = 0, \; R_\omega = \dfrac{D_\omega}{\tau_\omega^2}, \text{ and } G_\omega = \dfrac{D_\omega}{\tau_\omega}$$

while the block $\Sigma_\omega$ can be written in the form of (14) with $$J_\varphi = 0, \; R_\varphi = \dfrac{D_\varphi}{\tau_\varphi^2}, \text{ and } G_\varphi = \dfrac{D_\varphi}{\tau_\varphi}.$$

Using the Static Controller:

The simplest implementation is to use the static controllers $$\Sigma_\omega = 1 \text{ and } \Sigma_\varphi = 1. \quad (16)$$

This is equivalent to the implementation with an integrator having zero time constant in the previous subsection.

In this case, the output voltage (4) becomes $$e = \varphi_d \omega_d z. \quad (17)$$

TABLE II

SYSTEM PARAMETERS.

| Parameter | Value | Parameter | Value |
|---|---|---|---|
| $L_1, L_2$ | 2.5 mH, 1 mH | $P_{set}$ | 400 W |
| $R_1, R_2$ | 0.5 Ω | $Q_{set}$ | 200 var |
| $C_f$ | 22 μF | RL load R | 54.45 Ω |
| $V_n, f_n$ | 110 V, 60 Hz | RL load L | 48 mH |
| $V_g, f_g$ | 112 V, 59.8 Hz | $S_n$ | 1 kVA |

Validation with Computational Simulations

The disclosed control framework is validated with computational simulations for the system shown in FIG. 1. The system parameters are given in Table II. The control parameters are determined as follows:

Droop of frequency: 1% of frequency variation for 100% of variation in T (hence in P) resulting in $$D_\omega = \frac{1\% \omega_n}{T_n} = \frac{1\% \omega_n^2}{S_n} = 1.42;$$

Droop of flux: 5% of flux (voltage) variation for 100% of variation in Γ (hence in Q), resulting in $$D_\varphi = \frac{5\% \varphi_n}{\Gamma_n} = \frac{5\% \varphi_n^2}{S_n} = 8.51 \times 10^{-6};$$

Time constants for the controller blocks $\Sigma_\omega$ and $\Sigma_\varphi$: $\tau_\omega = 0.002$ s and $\tau_\varphi = 0.02$ s so that the frequency channel and the flux channel have different time scales;

Gains of the integrators in the integrator blocks $I_\omega$ and $I_\varphi$: $k_\omega = 11.84$ and $k_\varphi = 4.32 \times 10^{-4}$, which are commensurate with $D_\omega$ and $D_\varphi$.

Figure 4:
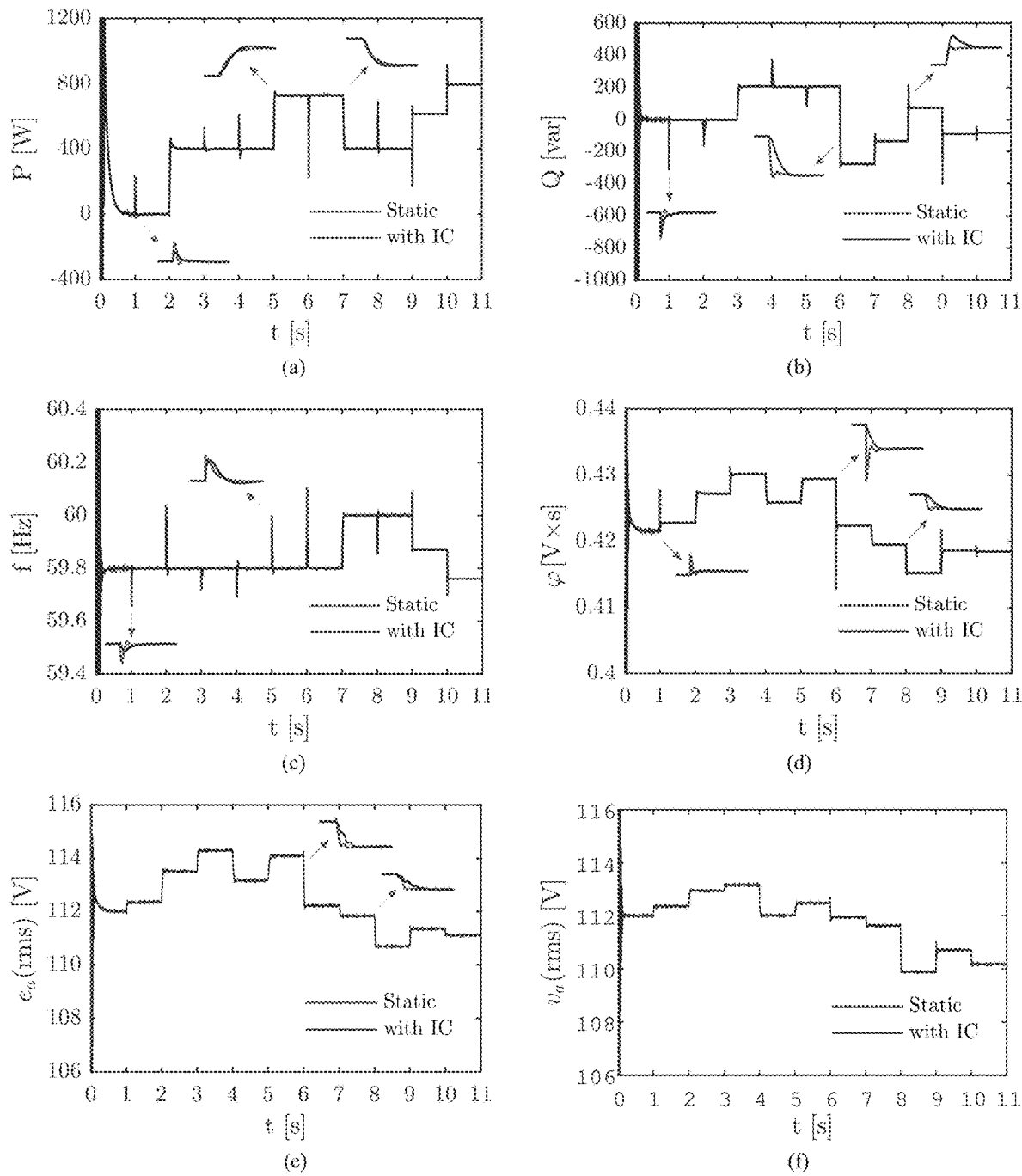
FIG. 4 illustrates the simulation results: (a) Active power P; (b) Reactive power Q; (c) Frequency f; (d) Flux $\varphi$; (e) Phase-A voltage $e_a$ (rms); and (f) Phase-A voltage $v_a$ (rms).

The converter has the rated power $S_n = 1$ kVA. The set-points for the torque and quorte are obtained from $$T_{set} = \frac{P_{set}}{\omega_n} \text{ and } \Gamma_{set} = \frac{Q_{set}}{\varphi_n},$$

respectively. The simulation results with both the static controller (Static) and the integral controller (with IC) are shown in FIG. 4. Both controllers perform very well. The static controller results in a faster response with larger overshoots than the integral controller, as expected because the static controller is equivalent to the case of the integral controller with zero time constants $\tau_\omega$ and $\tau_\varphi$.

Self-Synchronization:

This is mandatory before connecting the converter to the grid. As mentioned before, it is the same as the set mode for the converter to regulate T and Γ to 0 using the virtual current $i_v$, with the signals $S_\omega$ and $S_\varphi$ set at Low to enable the integrators. In order to show the robustness of the synchronization, the initial grid voltage has a phase angle of +50°, a frequency of 59.8 Hz and a phase voltage of 112 V (rms value). As shown in FIG. 4, the converter voltage settles down at 112 V and 59.8 Hz very quickly, achieving synchronization.

Operation after Synchronization:

After the converter achieves synchronization, it can be connected to the grid. In order to demonstrate the proposed control framework, different scenarios, including operation in both the grid-connected mode with grid frequency and voltage changes and the islanded mode with load change, are tested. The results are shown in FIG. 4, with detailed descriptions below:

t=1s, the Converter Breaker is closed with $T_{set}$ and $\Gamma_{set}$ remained at 0 to regulate T and Γ (hence P and Q) at 0 in the set mode. The physical current i is fed into the controller to calculate T and Γ. It can be seen from FIG. 4 that there is a very small and short transient, which means the grid connection is very smooth.

at t=2 s, step on $T_{set}$ to achieve $P_{set}=400$ W. The real power quickly increases and settles down at the set point 400 W. The flux φ and the voltages $e_a$ and $v_a$ all increase in order to dispatch the required real power. The frequency f increases in order to dispatch the increased real power but it returns to the grid frequency very quickly. There is a small coupling effect in Q but it quickly returns to 0 as well.

at t=3 s, step on $\Gamma_{set}$ to achieve $Q_{set}=200$ var. The reactive power Q quickly increases and settles down at the set point 200 var. The voltage further increases because of the increased reactive power. There is a small coupling effect in P but it returns to normal very quickly.

at t=4 s, turn on the Load Breaker to connect the series RL load of 54.45Ω and 48 mH (corresponding to 600 W and 200 var). There are some short spikes in P and Q but they quickly return to the original set-points of 400 W and 200 var because the converter is still working in the set mode. The real power and reactive power are not affected by the external condition. There is also a small short spike in the frequency but it returns to normal very quickly as well because the grid frequency remains unchanged. The load voltage drops a bit because the load increases, which causes the flux to decrease a bit too.

at t=5 s, the signal $S_\omega$ is changed to High to enable the frequency droop. Because the grid frequency 59.8 Hz is below the rated frequency 60 Hz, the converter increases the real power automatically by $$\frac{0.2}{60} \times \frac{1000}{1\%} = 333$$

W to 733 W, attempting to regulate the grid frequency. However, the grid frequency is fixed at 59.8 Hz so the frequency f quickly increases and returns back to 59.8 Hz. The reactive power is still operated in the set mode so the reactive power quickly returns to 200 var after a small transient due to the coupling effect. The load voltage increases slightly because the real power dispatched increases.

at t=6 s, the signal S, is changed to High to enable the flux (voltage) droop. Because the voltage $e_a$ is about 114 V, which is above the rated voltage 110 V, the converter decreases the reactive power automatically to regulate the voltage to a value determined by the system parameters. For the system under simulation, the reactive power is reduced by 500 var to −300 var, with the voltage $e_a$ settling down at 112 V. The load voltage $v_a$ drops accordingly. The frequency is still maintained by the grid at 59.8 Hz and the real power remains more or less unchanged. Because of the change of the reactive power, the current increases slightly.

at t=7 s, the grid frequency is changed to the rated value at 60 Hz. The frequency f quickly tracks the change of the grid frequency and settles down at 60 Hz. Because the converter is working in the frequency droop mode, the real power reduces automatically by $$\frac{0.2}{60} \times \frac{1000}{1\%} = 333$$

W from 733 W to 400 W, the original set-point for the real power. This causes the voltage $e_a$ to drop a bit, which then causes the reactive power to recover (increase) a bit.

at t=8 s, the grid voltage is changed to the rated value at 110 V. The voltage $v_a$ drops below 110 V, which causes the voltage $e_a$ to drop too. As a consequence, the reactive power increases. The real power and the frequency remain more or less unchanged after a short transient.

at t=9 s, the grid is changed back to 59.8 Hz and 112 V and the main breaker is opened to operate the converter in the islanded mode. The change of the grid frequency and voltage does not matter. What matters is the change of the operation mode from the grid-connected to the islanded mode. As can be seen from FIG. 4, the transition is very smooth. The real power increases by 200 W to 600 W because of the load, which causes the frequency to drop by $$1\% \times \frac{200}{1000} \times 60 = 0.12$$

Hz to 59.88 Hz (from 60 Hz). The reactive power of the filter capacitor is about −300 var. Adding the load reactive power about 200 var, the reactive power is about −100 var. Taking into account the reactive power of the filter inductor, the total reactive power is about −90 var, which is consistent with the value shown in FIG. 4(*b*). The drop of the reactive power causes the voltages $e_a$ and $v_a$ and the flux to increase slightly.

at t=10 s, an additional 200Ω load is connected to each phase (corresponding to 180 W). The real power increases quickly and the frequency drops by $$1\% \times \frac{180}{1000} \times 60 = 0.108$$

Hz to 59.772 Hz. As expected, the change in the reactive power is very small and so are the changes of the flux V and the voltages $e_a$ and $v_a$.

As can be seen from the zoomed-in details of the transients, the transients are very fast and often settle down within two cycles even for the integral controller (IC). The frequency and the flux only change within very small ranges. The torque T and the quorte Γ look very similar to the real power P and the reactive power Q, respectively, apart from having different values, and hence are not shown. It is worth noting that the load voltage $v_a$ is well maintained around the rated value during the whole process, which is an important requirement.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A controller to operate a power electronic converter as a cyber synchronous machine (CSM), comprising
   a torque-frequency channel configured to generate a frequency according to first inputs consisting of a torque set-point, a negative torque feedback signal and a frequency reference;
   a quorte-flux channel configured to generate a flux according to second inputs consisting of a quorte set-point, a negative quorte feedback signal and a flux reference;
   an engendering block configured to receive the frequency generated in the torque-frequency channel, the flux generated in the quorte-flux channel, and an input current, wherein the engendering block is configured to generate an output voltage, a torque signal, a quorte signal, the negative torque feedback signal, and the negative quorte feedback signal;
   a virtual impedance configured to generate a virtual current according to a difference of two voltages;
   a switch configured to choose the virtual current or an external current as the input current to the engendering block;
   a first integrator block with a reset input configured to generate an offset signal that is added to a rated frequency to form the frequency reference for the torque-frequency channel; and
   a second integrator block with a reset input configured to generate an offset signal that is added to a rated flux to form the flux reference for the quorte-flux channel.

2. The controller of claim 1, wherein the engendering block contains an oscillator that generates sinusoidal and cosinusoidal signals, as its states, at the frequency generated by the torque-frequency channel.

3. The controller of claim 2, wherein the engendering block generates a sinusoidal vector consisting of equally spaced sinusoidal signals, according to a number of phases of a converter, which are represented as a linear combination of the sinusoidal and cosinusoidal signals generated by the oscillator.

4. The controller of claim 3, wherein the engendering block generates the output voltage by multiplying the sinusoidal vector with the frequency generated in the torque-frequency channel and the flux generated in the quorte-flux channel.

5. The controller of claim 3, wherein the engendering block generates the torque signal by multiplying the flux with an inner product of the sinusoidal vector and the input current.

6. The controller of claim 2, wherein the engendering block generates a cosinusoidal vector consisting of equally spaced cosinusoidal signals, according to a number of phases of a converter, which are represented as a linear combination of the sinusoidal and cosinusoidal signals generated by the oscillator.

7. The controller of claim 6, wherein the engendering block generates the quorte signal by multiplying the negative of the frequency with an inner product of the cosinusoidal vector and the input current.

8. The controller of claim 1, wherein the torque-frequency channel consists of a first block that converts a sum of the torque set-point and the negative torque feedback signal into an offset added to the frequency reference to generate a desired frequency and a second block to generate the frequency from the desired frequency.

9. The controller of claim 8, wherein the first block is a constant gain frequency droop coefficient that reflects an impact of a torque variation on a frequency variation.

10. The controller of claim 1, wherein the quorte-flux channel consists of a third block that converts a sum of the quorte set-point and the negative quorte feedback signal into an offset added to the flux reference to generate a desired flux and a fourth block to generate the flux from the desired flux.

11. The controller of claim 10, wherein the third block is a constant gain flux droop coefficient that reflects an impact of a quorte variation on a flux variation.

12. The controller of claim 1, wherein the virtual impedance represents an impedance of a complex network.

13. The controller of claim 1, wherein one of the two voltages used to generate the virtual current is the output voltage and the other is a voltage measured from the power electronic converter.

14. The controller of claim 1, wherein the two voltages used to generate the virtual current are both measured from the power electronic converter.

15. The controller of claim 1, wherein the first integrator block with a reset input consists of an integrator in series with a gain and an additional transfer function.

16. The controller of claim 1, wherein the second integrator block with a reset input consists of an integrator in series with a gain and an additional transfer function.

17. The controller of claim 1, wherein a reset function for the first integrator block and the second integrator block comprises disconnecting or disabling the corresponding integrator block.

18. The controller of claim 1, wherein the output voltage is a control signal for the power electronic converter.

19. The controller of claim 1, wherein the output voltage and the virtual current are added together to create a control signal for the power electronic converter.

20. The controller of claim 1, wherein the torque signal is filtered prior to completing a negative torque feedback loop, and the quorte signal is filtered prior to completing a negative quorte feedback loop.

* * * * *